US008317926B2

(12) United States Patent
Reynoldson

(10) Patent No.: US 8,317,926 B2
(45) Date of Patent: Nov. 27, 2012

(54) DUPLEX SURFACE TREATMENT OF METAL OBJECTS

(75) Inventor: Ray William Reynoldson, Launching Place (AU)

(73) Assignee: Hard Technologies Pty Ltd., Victoria (AU)

( * ) Notice: Subject to any disclaimer, the term of this patent is extended or adjusted under 35 U.S.C. 154(b) by 747 days.

(21) Appl. No.: 11/989,092

(22) PCT Filed: Jul. 20, 2006

(86) PCT No.: PCT/AU2006/001031

§ 371 (c)(1),
(2), (4) Date: Jul. 7, 2009

(87) PCT Pub. No.: WO2007/009190

PCT Pub. Date: Jan. 25, 2007

(65) Prior Publication Data

US 2009/0297725 A1 Dec. 3, 2009

(30) Foreign Application Priority Data

Jul. 21, 2005 (AU) ................................ 2005903894

(51) Int. Cl.
*C23C 16/00* (2006.01)
*C23C 16/442* (2006.01)

(52) U.S. Cl. ......................... 118/733; 118/716; 118/717

(58) Field of Classification Search .................. 118/716, 118/717, 733
See application file for complete search history.

(56) References Cited

U.S. PATENT DOCUMENTS

| | | | | |
|---|---|---|---|---|
| 3,249,462 | A | 5/1966 | Jung et al. | |
| 3,672,207 | A * | 6/1972 | Cramp et al. | 73/40.7 |
| 4,145,258 | A * | 3/1979 | Fujishiro et al. | 202/248 |
| 4,271,207 | A * | 6/1981 | Loser et al. | 427/6 |
| 4,461,656 | A | 7/1984 | Ross | |
| 4,481,264 | A | 11/1984 | Faure | |

(Continued)

FOREIGN PATENT DOCUMENTS

DE 2306402 2/1973

(Continued)

OTHER PUBLICATIONS

PCT/ISA/210 International Search Report, International Application No. PCT/AU2006/001031, dated Sep. 7, 2006, 5 pages.

(Continued)

*Primary Examiner* — Jeffrie R Lund

(74) *Attorney, Agent, or Firm* — Heslin Rothenberg Farley & Mesiti PC

(57) ABSTRACT

The specification discloses a method and apparatus enabling the formation of a diffusion surface layer on a surface of a metal substrate, typically a ferrous based metal substrate, wherein in a first stage in a first fluidized bed furnace, a diffusion zone is formed extending inwardly from the surface of the metal substrate in which nitrogen has been diffused to form a nitride or carbo nitride inner zone and an outer white layer that is substantially free of porosity, treating the substrate formed in the first stage to prevent formation of or remove any surface oxide on the surface of the substrate, and in a second stage separate from the first stage, holding the thus treated substrate in a fluidized bed furnace operated under an inert atmosphere and fluidized by a flow of inert gas or gases, the substrate in the fluidized bed furnace being treated in the presence of a halide gas and a particulate metal or metal alloy.

20 Claims, 8 Drawing Sheets

U.S. PATENT DOCUMENTS

| | | | | | |
|---|---|---|---|---|---|
| 4,512,821 | A * | 4/1985 | Staffin et al. | 148/209 |
| 4,524,957 | A * | 6/1985 | Staffin et al. | 266/252 |
| 4,569,862 | A * | 2/1986 | Arai et al. | 427/255.21 |
| 4,844,949 | A * | 7/1989 | Arai et al. | 427/213 |
| 5,146,869 | A * | 9/1992 | Bohannon et al. | 118/724 |
| 5,326,725 | A * | 7/1994 | Sherstinsky et al. | 438/778 |
| 5,443,686 | A * | 8/1995 | Jones et al. | 216/37 |
| 5,620,521 | A * | 4/1997 | Tachikawa et al. | 118/717 |
| 5,862,302 | A * | 1/1999 | Okase | 392/416 |
| 5,997,963 | A * | 12/1999 | Davison et al. | 427/582 |
| 6,142,773 | A * | 11/2000 | Shimazu | 432/241 |
| 6,287,984 | B1 * | 9/2001 | Horie | 438/758 |
| 6,849,132 | B2 * | 2/2005 | Warnes et al. | 118/715 |
| 6,918,963 | B2 * | 7/2005 | Fan et al. | 118/716 |
| 7,651,568 | B2 * | 1/2010 | Ishizaka et al. | 118/715 |
| 7,655,091 | B2 * | 2/2010 | Madar et al. | 117/202 |
| 2003/0015142 | A1 * | 1/2003 | Hwang et al. | 118/733 |
| 2004/0182317 | A1 * | 9/2004 | Fan et al. | 118/716 |
| 2009/0297725 | A1 * | 12/2009 | Reynoldson | 427/535 |

FOREIGN PATENT DOCUMENTS

| | | | |
|---|---|---|---|
| EP | 0018263 | A1 | 10/1980 |
| EP | 0 252 480 | A2 | 1/1988 |
| EP | 0 161 684 | B1 | 11/1988 |
| EP | 0 166 216 | B1 | 1/1989 |
| EP | 0264448 | B1 | 2/1990 |
| EP | 0 268 248 | B1 | 2/1993 |
| EP | 0 303 191 | B1 | 12/1994 |
| EP | 0 471 276 | B1 | 2/1996 |
| EP | 0919642 | A2 | 6/1999 |
| FR | 1410647 | | 9/1965 |
| GB | 1 477 493 | | 6/1977 |
| GB | 2132230 | A | 7/1984 |
| GB | 2171420 | A | 8/1986 |
| JP | 52034669 | A * | 3/1977 |
| JP | 58025474 | A * | 2/1983 |
| JP | 63192864 | A * | 8/1988 |
| JP | 64-046574 | | 2/1989 |
| JP | 03249936 | A * | 11/1991 |
| WO | WO-86/01541 | A1 | 3/1986 |
| WO | WO-87/02073 | A1 | 4/1987 |
| WO | WO-99/14400 | A1 | 3/1999 |
| WO | WO-00/47794 | A1 | 8/2000 |

OTHER PUBLICATIONS

Nov. 23, 2010 Supplementary European Search Report in European Application No. 06760892.

* cited by examiner 10
11
12
13
14
16
17
18
19
20
20'
21
22
23
24
25
26
27
28
80
81

GD-OES composition analysis of DST-Cr surface on AISI H13 hot-work tool steel in atomic percent.

DUPLEX SURFACE TREATMENT OF METAL OBJECTS

Cross Reference to Related Applications

This application is a National Stage filing under 35 U.S.C. §371 of PCT/AU2006/001031 filed Jul. 20, 2006, which claims priority to Australian Patent Application No. AU2005903894 filed Jul. 21, 2005, each of which is incorporated herein by reference.

The present invention relates to methods and apparatus for heating a metal substrate to achieve a diffusion surface layer on the substrate.

Duplex surface treatments have traditionally comprised forming a nitrided surface on the substrate followed by a physical vapour deposition of a coating such as titanium or chromium nitride or carbon nitrocarburising onto the surface as an adhered coating. Some work has also been carried out where the surfacing material is diffused into the surface zone of the substrate simultaneously as nitrogen diffuses towards the surface making a chromium or titanium nitride or carbon nitride layer on the surface. The published patent specification of European Patent Nos. 0471276, 0252480, 0303191 and an International Publication Number WO/47794 disclose such treatment methods. Such methods are capable of providing a better performing surface treatment because, the surface layer is a diffusion layer and not simply a coating layer adhered to the substrate, however, practical control of the required materials and parameters to achieve this desirable result has proven to be quite difficult. The use of a halide gas such as HCl mixed with a reactive gas or a combustible gas such as hydrogen and/or ammonia leads to problems in the construction of the mixing gas panel. The halide gas can react instantly at low temperatures with ammonia forming ammonium chloride which may block the gas pipes and even leak back into the solenoid valves and flow meters of the gas delivery equipment causing blockages and potential damage to the equipment. Thus it is desirable to isolate the possible reactive gases from the halide gas until they are ready to mix in the fluidized bed furnace and then react with the metal powders to achieve the desired metal diffusion. However, when gases are separately introduced into a fluidized bed, it is difficult to get uniform mixing of the gases within the bed and then uniformity of treatment of the product being treated is difficult.

The objective therefore, of the present invention is to provide methods, and apparatus for use in the methods, that will enable diffusion surface layers to be reliably, safely and economically formed on metal substrates.

According to a first aspect of this invention there is provided a method of forming a diffusion surface layer on a surface of a metal substrate, said method including:

(i) in a first stage forming a diffusion zone extending inwardly from the surface of said substrate in which nitrogen has been diffused to form a nitride or carbo nitride inner zone and an outer white layer, said white layer being substantially free of porosity;

(ii) treating the substrate formed in said first stage to either prevent formation of a surface oxide on said surface or to remove any said surface oxide formed on said surface; and (iii) in a second stage separate from said first stage, the metal substrate treated as defined in (ii), is held within a fluidized bed furnace containing an inert particulate refractory material at a low temperature operated under an inert atmosphere, the particulate refractory material of said fluidized bed furnace being fluidized by a flow of an inert gas or gases, and the substrate in said fluidized bed furnace being treated in the presence of a halide gas and a particulate metal or metal alloy.

In one preferred embodiment, the treatment steps (ii) might include mechanical treatment such as polishing the surface to remove any said surface oxide. In an alternative to the aforesaid, the substrate from the first stage may be transferred to the second stage while maintaining an inert atmosphere surrounding the substrate. In yet another possible alternative any existing surface oxide is removed by treatment in the second stage of the process. Such treatment in the second stage of the process may include treating the surface of the substrate with a combination of the halide gas and hydrogen.

Whilst it is generally preferred that the first stage of the process be carried out in a fluidized bed furnace, conveniently separate from the fluidized bed furnace used in the second stage of the process, this is not essential and the first stage of the process might be performed in any one of a salt bath, gas heat treatment equipment, or vacuum plasma equipment. It is possible also for the first and second stages of the process to be carried out in the same fluidized bed furnace but at different times.

In a further preferred aspect, the first stage of the process may be carried out with the supply of ammonia gas to the fluidized bed furnace, the ammonia gas being less than 20% of the complete gas flow to the fluidized bed furnace. Conveniently the ammonia gas comprises between 5 and 10% of the total gas flow to the fluidized bed furnace utilized in the first stage of the process.

Conveniently, the metal substrate may be made from metal materials such as a ferrous based metal including steel and steel alloys, as well as from titanium, aluminium, and alloys of titanium and aluminium. Preferably the metal substrate is a preformed or pre-machined metal product.

Preferably the halide gas might be achieved by introducing a halogen salt or acid to the fluidized bed furnace. The halide gas might be formed from HCl. Conveniently, the aforesaid halide gas is mixed with an inert carrier gas before entry into the fluidized bed furnace, the halide gas and said inert carrier gas entering the inert particulate refractory containing zone of the fluidized bed furnace, enters at a lower region thereof. Preferably the halide gas comprises between 0.2 and 3% of the inert carrier gas fluidizing the fluidized bed furnace and is preferably heated before entry into the fluidized bed furnace. The aforesaid heating of the halide gas may occur by heat exchange with at least a portion of the fluidized bed furnace, such as for example, by passing the delivery means for the halide gas/inert carrier gas through the zone of the fluidized bed furnace containing the particulate material to the lower region of the fluidized bed furnace. The inert carrier gas for the halide gas may be the same or different inert gas to that which is used to fluidize the particulate material in the fluidized bed furnace. The inert gas used to fluidize the fluidized bed furnace may be selected from inert argon or inert nitrogen.

Preferably, the particulate (powdered) metal or metal alloy introduced into the particulate refractory material in the fluidized bed furnace is selected from metals of group IVA, VA, VIA or VIIA, iron or alloys of these metals. The particulate metal or metal alloy might be selected from chromium, titanium, vanadium, niobium, tantalum, tungsten, molybdenum and manganese, or alloys of these metals including ferrous based alloys.

Conveniently the percentage of the particulate metal relative to the particulate refractory material in the fluidized bed furnace is between 5 and 30 weight percent. Preferably the temperature of operation of the fluidized bed furnace is below 750° C. and preferably below 700° C. The operating temperature of the fluidized bed furnace is between 500 and 700° C. The time of treatment of the substrate within the fluidized bed furnace is between 1 and 16 hours, more preferably between 3 and 8 hours.

According to a further aspect, the present invention also provides a method of forming a diffusion zone extending inwardly of a metal substrate surface in which nitrogen has been diffused to form a nitride or carbo nitride inner zone and an outer white layer, said method including placing the metal substrate in a fluidized bed furnace operated at a temperature of no greater than 700° C., and supplying ammonia gas in an amount no greater than 20% of a total gas flow to said fluidized bed furnace. Preferably, the ammonia gas flow to the fluidized bed furnace may be between 3 and 15%, preferably between 5 and 10% of the total gas flow to the fluidized bed furnace.

In accordance with a second aspect, the present invention also provides a fluidized bed furnace for heat treatment of metal substrates, said fluidized bed furnace including:

- a retort having an access opening for introduction into and removal of metal substrates from said retort and containing inert particulate refractory material adapted to be fluidized in use;
- heat supply means to maintain a predetermined temperature or temperature range within said retort;
- a first gas supply means arranged to provide a first inert gas flow entering said retort at a lower region thereof through distributor means to fluidize the particulate refractory material in said retort;
- a second gas supply means arranged to provide a second gas flow entering said retort at or adjacent said lower region thereof separately to said first inert gas flow, said second gas supply means including heating means to heat said second gas flow before said second gas flow enters the retort;
- means to combine a halide gas in a predetermined proportion with an inert carrier gas to form said second gas flow;
- cover means to open or close said access opening, said cover means closing said access opening during a treatment process; and
- a first seal means operable between said cover means and said retort when said cover means is positioned to close said access opening.

Preferably, the first seal means of the aforesaid fluidized bed furnace includes a first inner peripheral seal and a second outer peripheral seal each surrounding said retort access opening and defining a first seal zone therebetween, means being provided to introduce an inert gas under pressure into said first seal zone whereby, in use, any inert gas in said first seal zone tends to leak in a direction towards the access opening providing access to said retort. Conveniently, the first seal means includes a third peripheral seal located inwardly of said first inner peripheral seal, said third peripheral seal including a peripheral flange portion positionable in a region containing inert particulate refractory material when the cover means is positioned to close said access opening, a gas flow supply means being provided to said region to fluidize the inert particulate refractory material therein at least when the cover means is being moved to a position closing said access opening.

The cover means may include an opening or closing mechanism, the opening or closing mechanism enabling the cover means to be moved in an opening direction away from the access opening in an axial direction and then rotated about a pivot axis parallel to and spaced from a longitudinal axis of the retort with a reverse movement occurring when the cover means is moved to close said access opening. The cover means may be housed within an intermediate chamber through which access to and from said access opening is achieved, said intermediate chamber including an intermediate access opening aligned with the access opening to said retort, said intermediate chamber providing a sealed zone surrounding said cover means except for the intermediate access opening and the access opening to said retort.

The fluidized bed furnace may further include a transfer container means defining an internal holding zone accessed through a transfer container access opening, second seal means cooperable between said transfer container means and said intermediate chamber when the transfer container access opening is positioned adjacent the intermediate access opening of the intermediate chamber. Conveniently, the second seal means is configured similarly to the first seal means. The transfer container means may include a transfer container cover means to selectably open or close said transfer container access opening, third seal means being provided operable between said transfer container cover means and the transfer container access opening when the container cover is moved to a position closing said transfer container access opening. Conveniently, the third seal means is configured similarly to said first seal means. The transfer container means may further include an operating mechanism to open or close same, said operating mechanism enabling the transfer container cover means to be moved in an opening direction away from the transfer container access opening in an axial direction and then rotated about a pivot axis parallel to and spaced from a longitudinal axis of the transfer container with a reverse movement occurring when the transfer container cover means is moved to close said transfer container access opening.

Preferably when the second seal means is operationally engaged, the retort access opening, the access opening to the intermediate chamber and the access opening to the transfer container are aligned enabling a substrate to be treated to be transferred to and from said retort to the transfer container. Conveniently an inert gas supply means is provided to selectably supply inert gas to said transfer container to enable an inert gas atmosphere to be maintained therein when the transfer container cover means is closed or when it is open but the second seal means are engaged while a substrate to be treated is transferred from said transfer container to said retort. The inert gas supply means may also be arranged to selectably supply inert gas to said intermediate chamber.

The fluidized bed furnace may further include an exhaust gas flow path leading from said retort through a grit collection means to an exhaust gas treatment means, said gas flow path including scraper means to scrape solid deposits from said path and to move same into said collection means. In another possible arrangement, the fluidized bed furnace may further include an exhaust gas flow path leading from said retort, and a metering means to deliver the particulate metal or metal alloy in predetermined quantities into said retort via said exhaust gas flow path, said delivery occurring when minimal or no exhaust gas flow is occurring.

According to another aspect of this invention, there is provided a fluidized bed furnace for treatment of metal substrates, said fluidized bed furnace including:

- a retort having an access opening for introduction into and removal of metal substrates from said retort and containing inert particulate refractory material adapted to be fluidized in use;
- heat supply means to maintain a predetermined temperature or temperature range within said retort;

a first gas supply means arranged to provide a first inert gas flow entering said retort at a lower region thereof through distributor means to fluidize the particulate refractory material in said retort;

cover means to open or close said access opening, said cover means closing said access opening during a treatment process; and a first seal means operable between said cover means and said retort when said cover means is positioned to close said access opening;

said first seal means including a first seal chamber surrounding said access opening and means for supplying and maintaining an inert gas to said first seal chamber whereby the inert gas in said first seal chamber has a pressure higher than atmosphere and higher than gas pressure within said retort at least during a treatment process.

Conveniently the first cooperable seal engaging surfaces of the first seal means separate the first seal chamber from said retort. The second cooperable seal engaging surfaces of the first seal means may separate the first seal chamber from atmosphere. Conveniently, inert gas from the first seal chamber is arranged to preferentially leak past said first cooperable seal engaging surfaces towards the retort.

A further preferred feature of this aspect of the invention provides for the first seal means to include a second seal zone surrounding said access opening being inwardly located relative to the first seal chamber, said second seal zone having a peripheral flange portion positionable in a region containing inert particulate refractory material when the cover means is positioned to close said access opening, a gas flow supply means being provided to said region to fluidize the inert particulate refractory material therein at least when the cover means is being moved to a position closing said access opening.

In accordance with a still further preferred aspect of this invention, there is provided a fluidized bed furnace treatment arrangement including (i) at least two fluidized bed treatment devices arranged adjacent one another;

(ii) an openable and closable seal arrangement for an access opening means of each said fluidized bed treatment device to allow a metal object or objects to be treated to be introduced into or removed from a said fluidized bed treatment device;

(iii) heating means to maintain at least one of said fluidized bed treatment devices at a predetermined temperature or temperature range during a treatment stage;

(iv) fluidizing gas supply means provided to each said fluidized bed treatment device;

(v) a sealable chamber located above the fluidized treatment devices and sealingly surrounding said access opening means leading to said fluidized bed treatment devices;

(vi) means to supply and maintain an inert atmosphere within said sealable chamber during a treatment process;

(vii) an object handling mechanism located within said sealable chamber for introducing or removing a said metal object or objects into or from a said fluidized bed treatment device, and for moving the metal object or objects to be treated between said fluidized bed treatment devices; and sealable access means enabling a said metal object or objects to be treated to be arranged on said object handling mechanism within said sealable chamber.

A number of preferred embodiments will hereafter be described with reference to the accompanying drawings in which:

FIG. 1 is a cross-sectional view of part of a fluidized bed furnace arrangement capable of being used in the performance of the present invention;

FIGS. 2*a* and 2*b* are cross-sectional views of seal arrangements usable in the apparatus of FIG. 1 or adapted for use in other equipment disclosed herein;

As used herein "white layer" is intended to refer to a metal nitride, metal carbo nitride or mixtures thereof formed on the surface of a metal during a nitriding or nitrocarburising process. In the case of ferrous metal substrates, the white layer will be an iron nitride or an iron carbo nitride, typically either the epsilon and/or the gamma form.

Reference will now be made to FIGS. 1, 2*a*, 2*b* and 4 which schematically illustrate relevant parts of a fluidized bed treatment apparatus according to a preferred form of this invention, it being understood from the preceding disclosure that at least the first stage of the heat treatment process need not be completed in fluidized bed heat treatment equipment.

Figure 1:
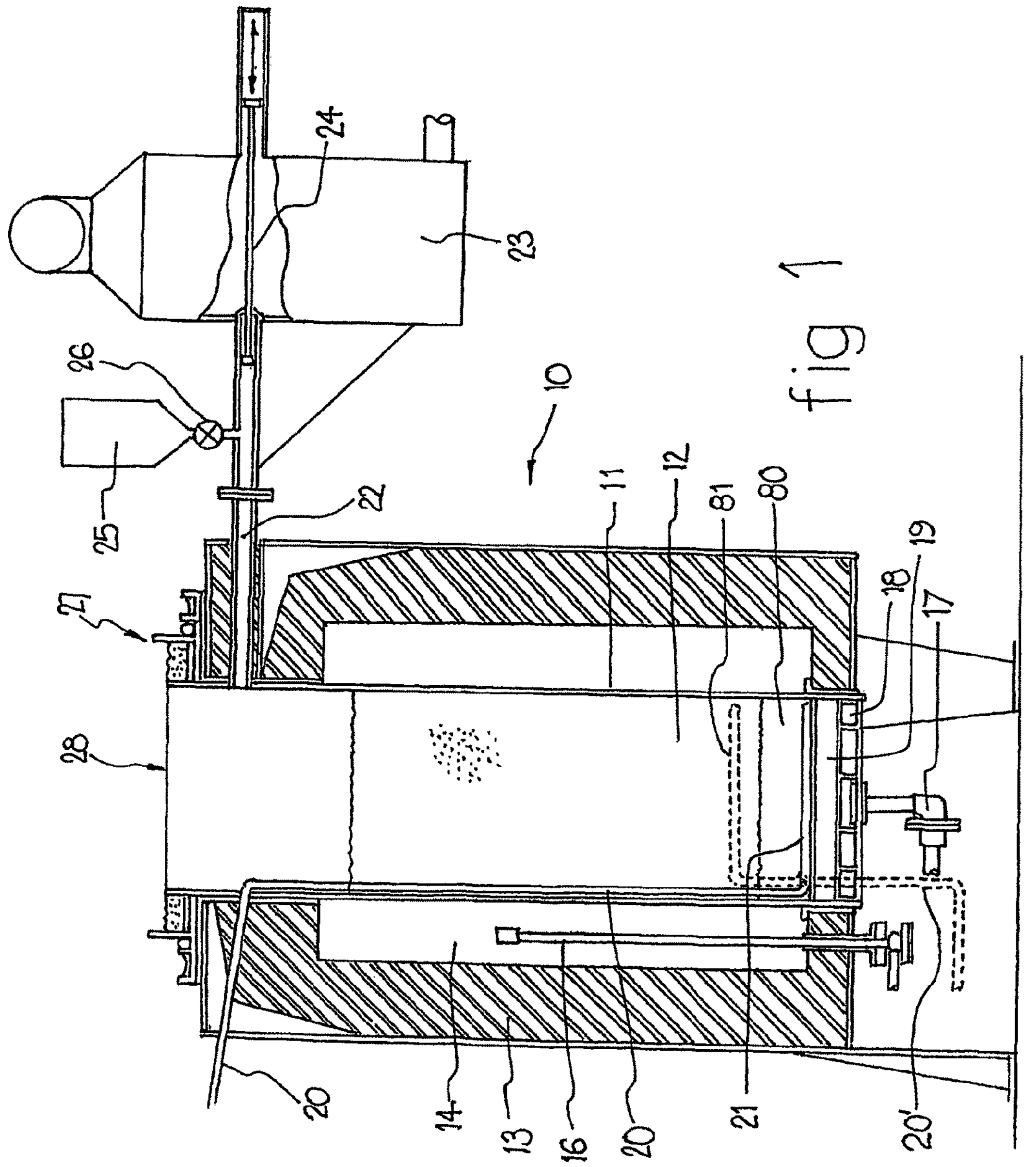

As illustrated in FIG. 1, the apparatus comprises a fluidized bed furnace 10 having an inner retort 11 containing a particulate inert refractory material 12 such as aluminium oxide ($Al_2O_3$), however, other such inert refractory materials can be employed. The furnace includes an outer insulating layer 13 and a heating zone 14 that might be heated in any conventional manner by combusting a fuel gas, by electrical resistance heating or by any other suitable means. In the drawings, the heating zone 14 is heated by a fuel gas supplied burner 16. At the bottom of the retort 11, a primary inert gas supply line 17 is provided for fluidizing the refractory material 12 when required. The gas supply line 17 leads to a gas distribution system comprised of a primary distributor 18 and a secondary distributor 19 typically of a porous material construction that is aimed at preventing streaming of the gas flow within the retort and thereby even fluidization and heat treatment. A further gas delivery line 20 is provided so that a halide gas and an inert carrier gas mixed therewith can be introduced into the bottom of the retort via a further distributor 21 separate from the distributors 18/19. The distributor 21 might be positioned in the coarse refractory material zone 80 in the lower region of the retort 11. As an alternative, the delivery line 20' may enter through the bottom of the retort as shown in broken outline or elsewhere subject to the distributor 21 being located in the lower region of the retort. In this arrangement the delivery line 20' might pass upwardly and include one or more heating coils 81 before returning the halide and inert cover gas to the distributor 21 in the lower region of the retort 11. The heating coil(s) 81 are conveniently just above or just within the coarse refractory material zone 80. It is preferred that the halide gas and the inert carrier gas be thoroughly mixed externally of the retort 11 and further that it be heated before the mixed gases enter the retort. Conveniently heating occurs by heat exchange with a region of the fluidized bed treatment furnace. With the illustrated arrangement, heating of the externally mixed gases occurs as the line 20 passes downwardly through the heated refractory material in the retort. Other arrangements are equally possible. For example one or more coils of the delivery pipe might be provided in the line 20 within the retort. Alternatively, the delivery line 20 might pass through the heating zone 14 with one or more coils located in the zone 14. Metering and mixing equipment (not illustrated) is used to ensure proper proportions of halide gas and inert carrier/fluidizing gases are used in the treatment process.

An exhaust passage 22 leads from an upper region of the retort 11 whereby exhaust gases can escape in a controlled manner and be treated downstream (not shown) for safety purposes. It is possible for some of the refractory material to escape along this path and this material is conveniently collected in a grit collection box or container 23. From time to time it is possible for certain reaction products to solidify in this passage 22 which might lead ultimately to the passage becoming blocked. A scraper mechanism 24 is therefore provided to scrape such materials, preferably back into the collection box 23. Conveniently particulate metal or metal alloy (for use in a treatment process) can also be introduced via the exhaust passage 22. A storage zone 25 for such particulate metal is provided with a metering valve or the like 26 to deliver a desired quantity of metal powder into the passage 22. The scraper mechanism 24 might then be used to push this metal into the retort when required. This is preferably done when the bed is slumped (ie not in operation) such that there is no or minimal gas flow in an outward direction along the passage 22.

Figure 2A:
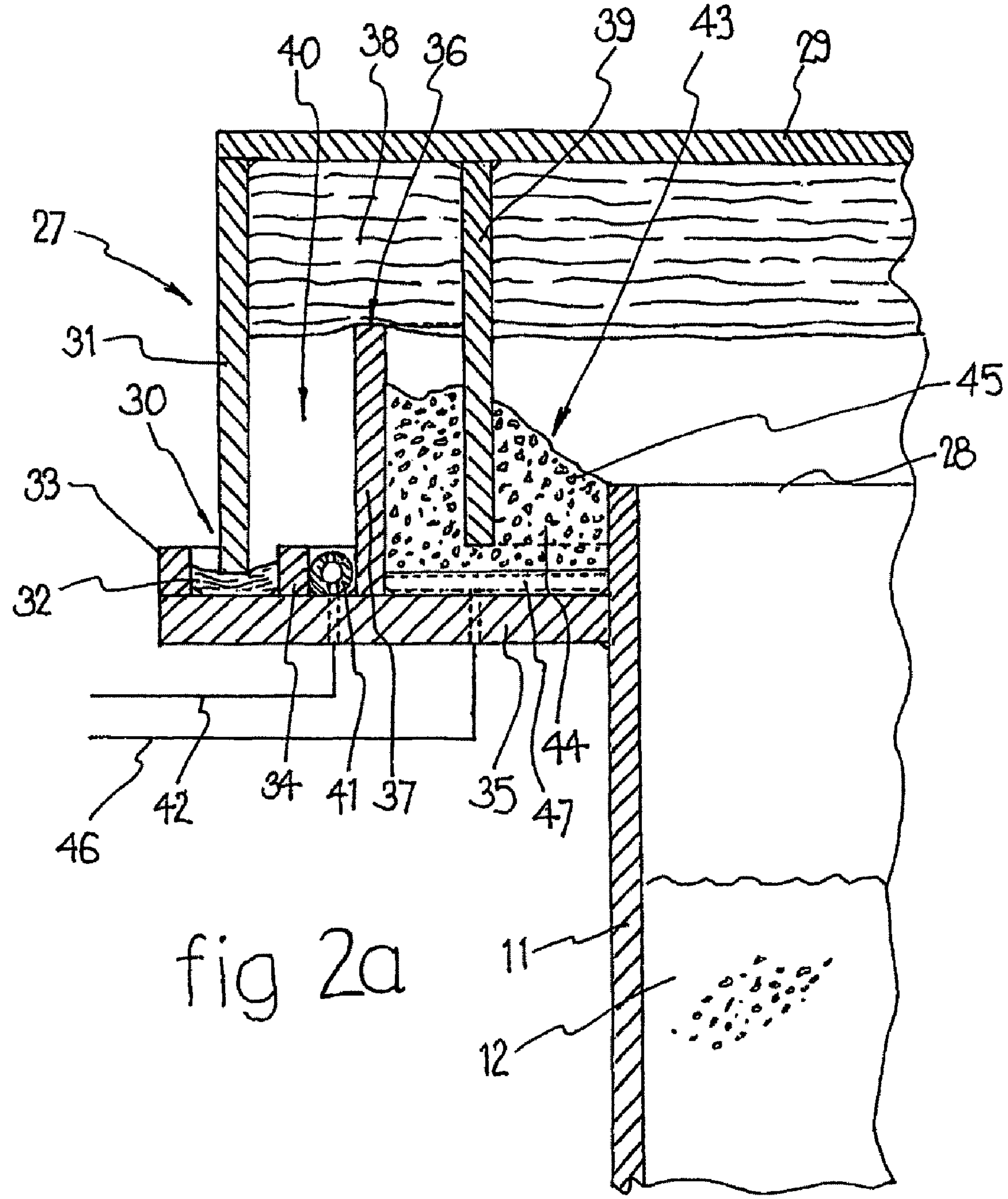

As shown in FIG. 1, part of a first seal means 27 is provided around the upper access opening 28 leading to the inner zones of the retort 11. Features of the first seal means 27 are better seen in FIGS. 2*a* or 2*b* where they are shown operationally with a cover member 29 for the upper access opening 28. The first seal means 27 comprises a first outer seal part 30 formed by a circumferential flange 31 on the cover member 29 engaging with a seal material 32 positioned between two circumferential and radially spaced flanges 33, 34 on a member 35 secured to the retort 11 and surrounding the access opening 28. The first seal means 27 further includes a second inner seal part 36 formed by circumferential flange 37 supported on the member 35 and engaging with a seal material 38 positioned between the outer flange 31 on the cover member 29 and a more inwardly located circumferential flange 39 carried by the cover member 29. The seal materials 32 or 38 may be any compressible seal material capable of operation at the relevant operating temperatures for the furnace, but may include ceramic fibre or VITON (registered trade mark) rubber material. When the first seal means 27 is operationally engaged as illustrated in FIG. 2*a*, a seal zone 40 is established between the flanges 31 and 37. A gas distributor tube 41 is located in this zone 40 and is fed externally via a line schematically shown at 42 to deliver nitrogen or some other inert gas to the zone 40 at a pressure whereby such gas will leak towards the retort opening 28 if leakage is possible thereby preventing ingress of oxygen into the retort 11. The seal means 27 further includes a third seal part 43 formed by the inner circumferential flange 39 being engaged in a zone 44 containing inert refractory particulate material 45 typically of the same type as contained within the retort 11. The particulate material 45 is fluidized by an inert gas supply delivered via line 46 to a distributor 47 therefor to assist at least entry of the flange 39 into the particulate material 45 as the cover member 29 moves to the illustrated closed position.

Figure 2B:
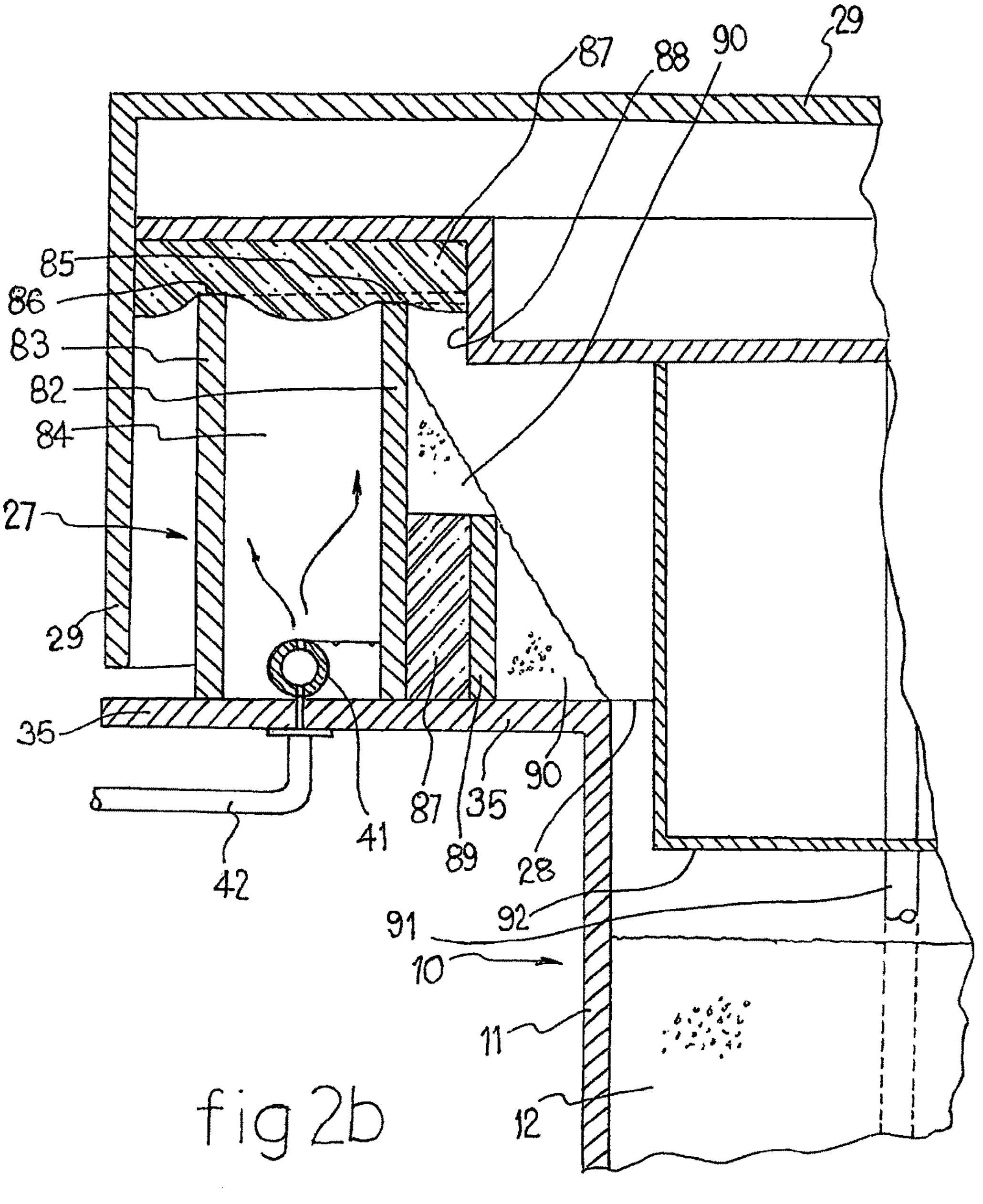

In the seal arrangement shown in FIG. 2*b*, two annular flanges 82, 83 are provided upstanding from the peripheral retort part or member 35 defining a seal zone 84 therebetween. The flanges 82, 83 are welded or otherwise secured to the retort part 35 and are of differing perimeter lengths to achieve the seal zone 84. The upper edges 85, 86 of the flanges 82 press into and seal with a suitable seal material 87 within an annular recess 88 in the cover member or lid 29. Preferably the upper edge 85 of flange 82 is marginally lower than the upper edge 86 of flange 83 whereby if gas leakage from the seal zone 84 occurs it will preferentially leak towards the inside of the retort 11 rather than externally of same. The seal material 87 might be the same type of material discussed above for seal material 32, 38 of FIG. 2*a*. An inert gas delivery tube 42 is provided to deliver inert gas (eg nitrogen) to a distributor ring 41 within the seal zone 84 such that when the furnace 10 is in use and the cover member 29 is closed, the seal zone 84 is pressurized with an inert gas at a pressure higher than atmosphere and higher than within the retort. Gas leakage from the seal zone 84 "may" occur in both directions past the upper flange edges 85, 86 but preferentially, if leakage does occur at all, it will occur past the edge 85 back towards the retort. Thus the required atmosphere is maintained within the retort without permitting unwanted oxygen to enter same from the external atmosphere. Inwardly of the seal zone 84 a further annular flange 89 is provided with a heat insulating material 87 therebetween which can be the same material as the seal material 87 discussed above. Refractory particle material 90 can build up as shown in FIG. 2*b*, but at a point where the slope of this material is about 60° to the horizontal, further such material will fall by gravity back into the retort 11, helped by any inert gas leakage inwardly past the flange edge 85. Thus escaping of refractory material from the retort is prevented or kept to a very low level. Conveniently the volume of the seal zone 84 is kept to a minimum to minimize inert gas usage. The lid or cover member 29 carries a treatment basket (or similar) support device 91 and the cover member 29 is conveniently at least insulated against heat loss. In some applications, particularly when batch processing, it may also be desirable to include cooling coils or tubes in the lid or cover member 29 to cool down the furnace 10 when desired at the end of a treatment operation. The lid or cover member 29 might also carry optionally, a plug 92 to minimize space above the treatment bed.

Figure 4:
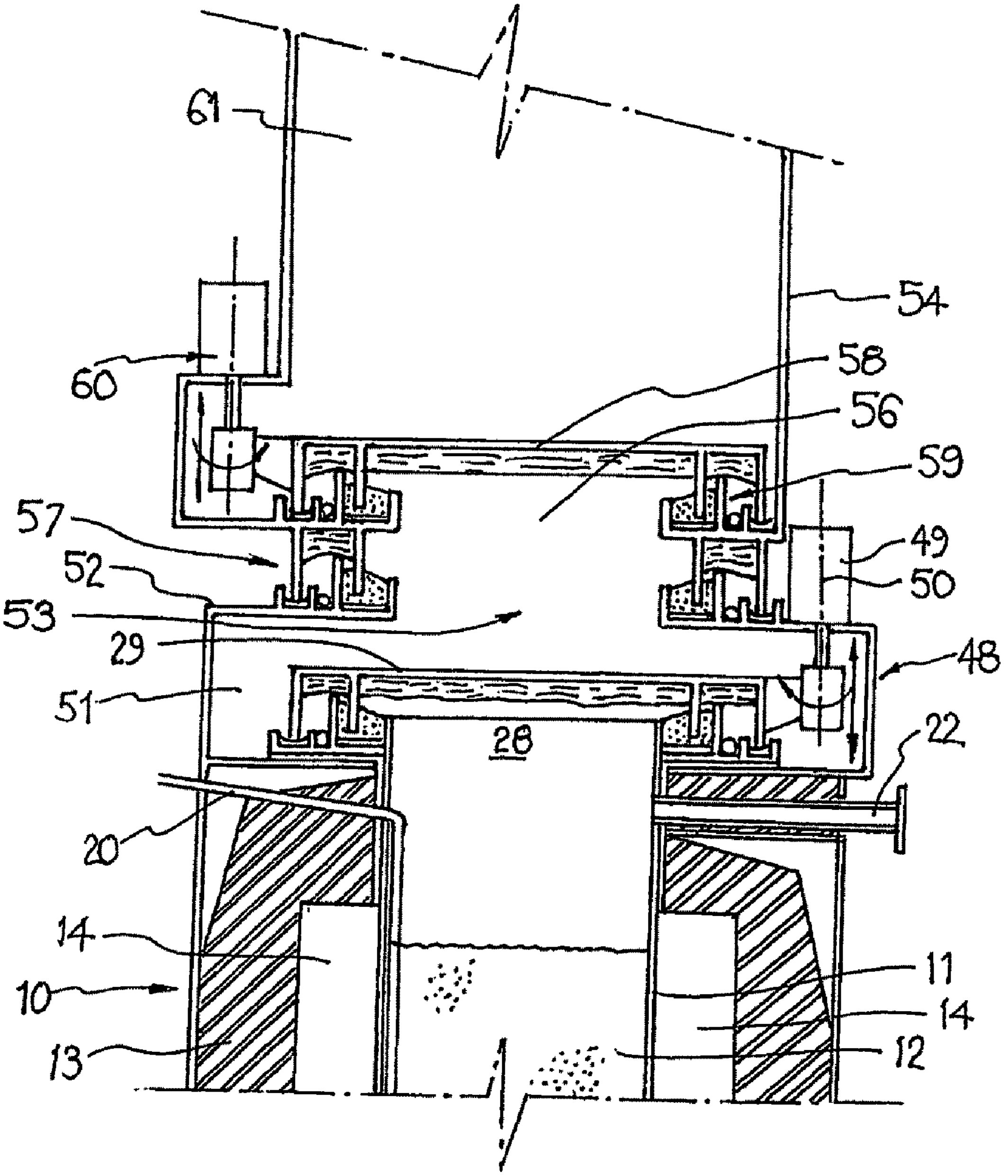
FIG. 4 is a cross-sectional view of seal arrangements operable between the treatment retort, the intermediate chamber and a transfer container.

FIG. 4 illustrates one preferred operating mechanism 48 for operating the cover member 29. The mechanism 48 includes a drive means 49 connected to the cover member 29 which is capable of axially moving the cover member away from the access opening 28 and then pivoting same about a rotational axis 50. As shown in FIG. 4, the cover member 29 is housed fully within an intermediate chamber 51 defined by a housing 52 therefore. The housing 52 has an upper intermediate chamber access opening 53 generally in line with the access opening 28 leading into the retort 11. The cover member 29 when in a closed position or in an opened position, remains fully within the intermediate chamber 51 which is sealed except for the openings 28 and 53 on either side.

FIG. 4 further illustrates a transport container 54 to enable transport of parts to be treated while maintaining an inert atmosphere therewithin. The container 54 is essentially closed at its upper ends with an access opening 56 in its lower face. A second seal means 57 is provided adapted to seal the lower face of the container 54 to the housing 52 of the intermediate chamber 51 when in the position illustrated in FIG. 4. The structure and operation of the second seal means 57 is conveniently the same as that of the first seal means 27 described above. The lower access opening 56 of the container 54 is also closed by a cover member 58 with a third seal means 59 operable between the cover member 58 and the container parts surrounding the opening 56. A cover member operating mechanism 60 (similar to the mechanism 48) is provided to move the cover member 58 between positions closing and opening the access opening 56. The transport container 54 will normally include mechanisms (not illustrated) for holding a part to be treated within the container or to transfer same to or from a retort 11 when docked in the position illustrated in FIG. 4. Means for selectively supplying a desired inert gas when required to the intermediate chamber 51 and to the zone 61 within the container or hood 54 is provided but has not been illustrated. The operation of this equipment is further described hereafter with reference to FIG. 3.

The process of this invention according to a number of preferred aspects will now be described. In a first stage, a metal part (or substrate) to be treated is, subjected to a surface treatment known generally as nitriding or nitrocarburising. This can be achieved in a variety of different apparatus including salt baths, gas heat treatment apparatus, vacuum plasma equipment and fluidized bed furnaces. It is, however, important that the so-called white layer established via this first stage is substantially without significant porosity. Other desirable factors also relate to the concentration, depth and microstructure of the white layer.

Figure 5:
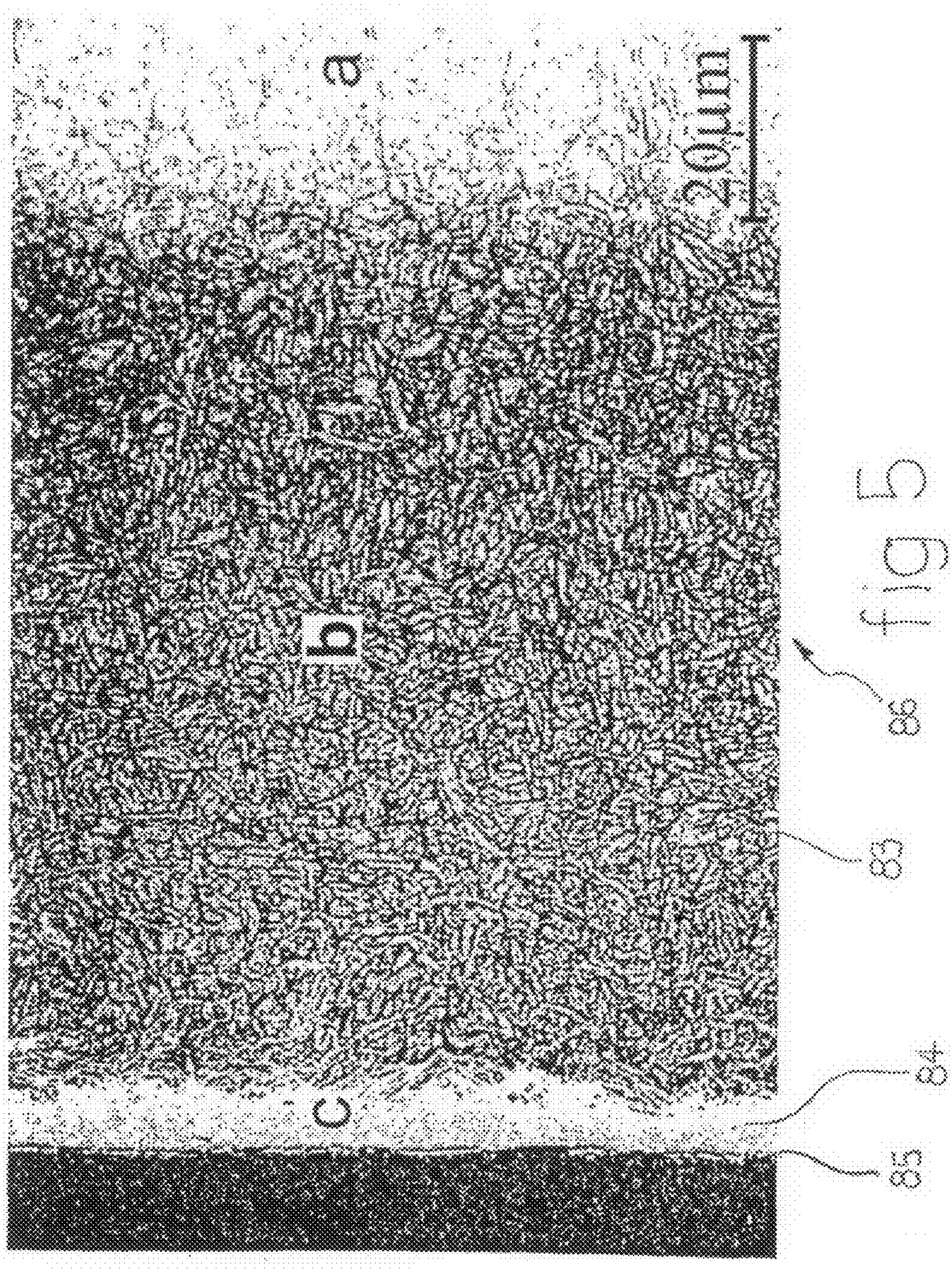
FIG. 5 shows a microstructure of a metal substrate where the first stage of the process has been satisfactorily completed.
Figure 6:
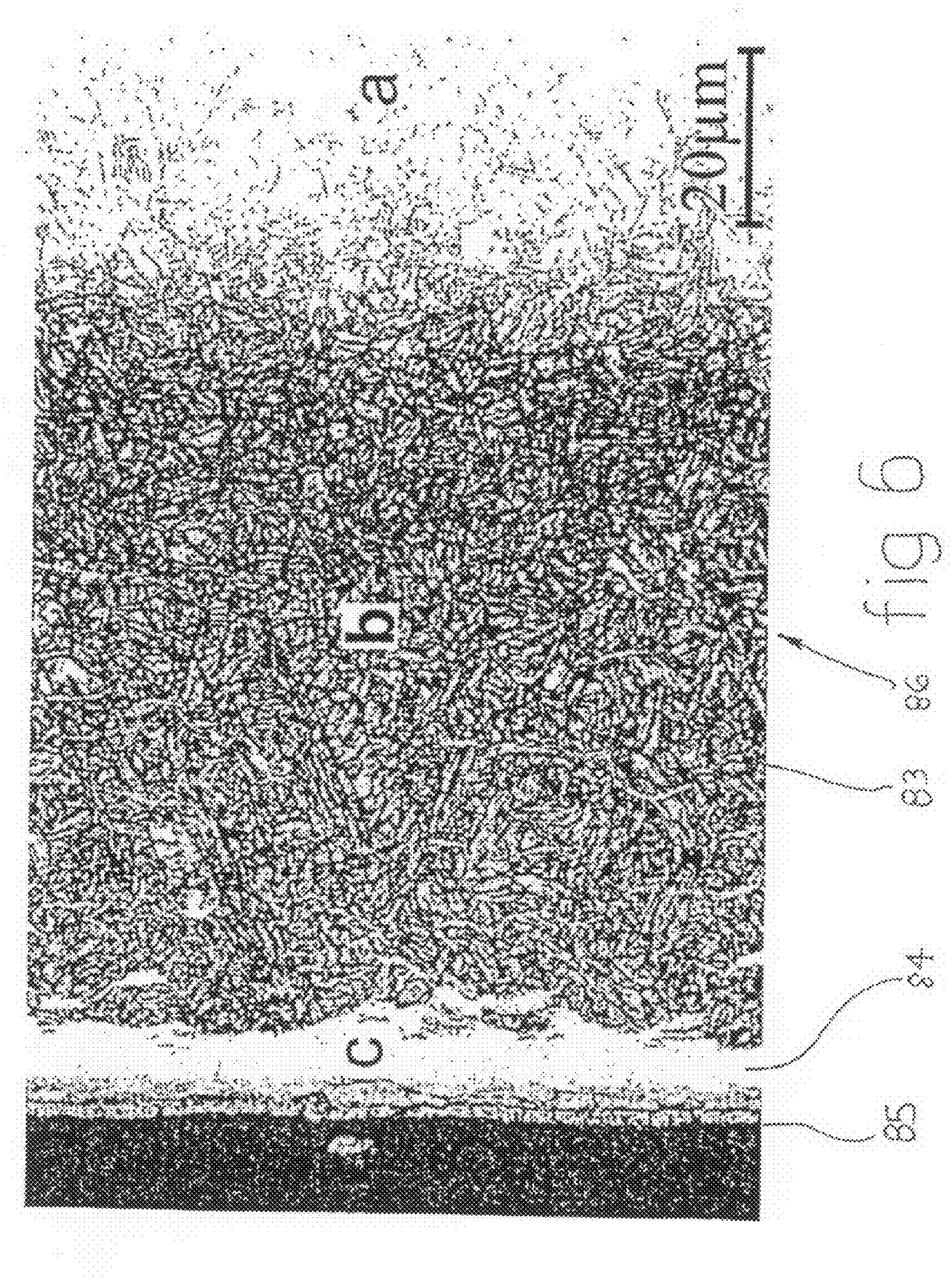
FIG. 6 shows a microstructure of a metal substrate where the first stage of the process has not been satisfactorily completed.

When producing a nitrided or nitro carburised structure, two zones are produced. The first zone is the diffusion zone 83 where nitrogen diffuses into the substrate through zone 6 from the substrate surface 85 and increases the hardness of the substrate 86, and the second zone is the white layer 84 which can consist of either the epsilon and/or the gamma layer. FIG. 5 shows a microstructure of a nitro carburised substrate with a satisfactory white layer (c) for further processing as described below. FIG. 6, on the other hand, shows a microstructure of a nitro carburised substrate where the white layer is porous and not satisfactory for further processing. The parameters for achieving a non-porous white layer suitable for further processing do vary depending upon the nature of the substrate being processed.

When the first stage of this process is carried out in a fluidized bed furnace, control of same requires the supply to the bed of ammonia/nitrogen (for nitriding) and a carbon bearing gas (eg natural gas and/or carbon dioxide) for nitrocarburising. During nitrocarburising, it is important that some oxygen is involved in the process which may be contributed by a hydrocarbon gas, carbon dioxide and/or oxygen. Once this first stage is completed satisfactorily, the part or substrate to be processed needs to be heated to ensure a surface oxide does not exist on the surface into which a metal is to be diffused. To obtain (or maintain) a suitable surface finish, one of the following options needs to be followed:

(i) the surface of the part or substrate might be mechanically treated such as by repolishing and then kept under an inert atmosphere before proceeding with the second stage;
(ii) the surface of the part or substrate should be maintained fully under an inert atmosphere between the first stage up to and including the second stage; or
(iii) any surface oxide formed on the surface of the part or substrate should be removed in the second stage with a combination of halide gas and hydrogen.

Options (ii) and (iii) above are preferred since (i) is generally not possible with complex shaped parts to be treated.

In the second stage of the process, the part or substrate is placed into and held in a fluidized bed furnace operated at a temperature below 750° C. and preferably no higher than 700° C. Conveniently the temperature is in the range of 500° C. to 700° C. The bed itself should include an inert refractory particulate material such as $Al_2O_3$ and the treatment should occur with the desired metal to be diffused into the surface in particulate or powder form in the bed. Such metal should preferably comprise between 5 to 30 weight percent of the bed materials, ie the balance being the inert refractory material. Treatment to diffuse the desired metal into the nitrogen based layer or zone of the substrate conveniently occurs with the bed being fluidized by an inert gas flow such as argon or nitrogen in the presence of a separately introduced halide gas (eg HCl) premixed into an inert carrier gas stream (eg nitrogen or argon).

Preferably, the metal powders introduced into the bed should be of high purity and conveniently without a surface oxide. Thus measures need to be taken to prevent air contact before the powders enter the bed and while they remain in the bed itself. The gases used also need to be of high purity. Common gases capable of use in the process are high purity nitrogen (less than 10 ppm oxygen), high purity argon (less than 5 ppm oxygen), and for the first stage processing, technical grade ammonia which has no more than 500 ppm water vapour and is further dried, for example by passing same through a desiccant before use. The halide gas used may typically be a technical grade HCl.

The halide gas typically will constitute between 0.2 and 3 percent of the gas flow to the treatment bed. The halide gas flow needs to be closely regulated and mixed thoroughly with the inert carrier gas before it enters the bed. This is important to avoid non uniformity within the bed. The halide gas should preferably be preheated before it enters the bed to ensure that it is in its most reactive stage when it contacts the part to be heated. Preheating of the halide gas and the inert carrier gas has the benefit of enabling a reduction in the amount of halide gas required.

It has been observed that the refractory powder (aluminium oxide powder) may also, over time, become contaminated and this can have an adverse affect on the process.

Equipment to carry out the process of this invention will desirably include first and second fluidized bed furnaces each with an upper intermediate isolation chamber as described previously, with a movable transport container or hood as described previously capable of moving between the two fluidized bed furnaces, also to and from a loading bay, and to and from a quenching fluidized bed. One of the two fluidized bed furnaces is intended to be used as a nitriding/nitrocarburising furnace and can, as discussed previously, be replaced by other equipment for achieving similar effects. The following description will, however, assume that two fluidized bed furnaces are used with some reference to FIG. 3.

Figure 3:
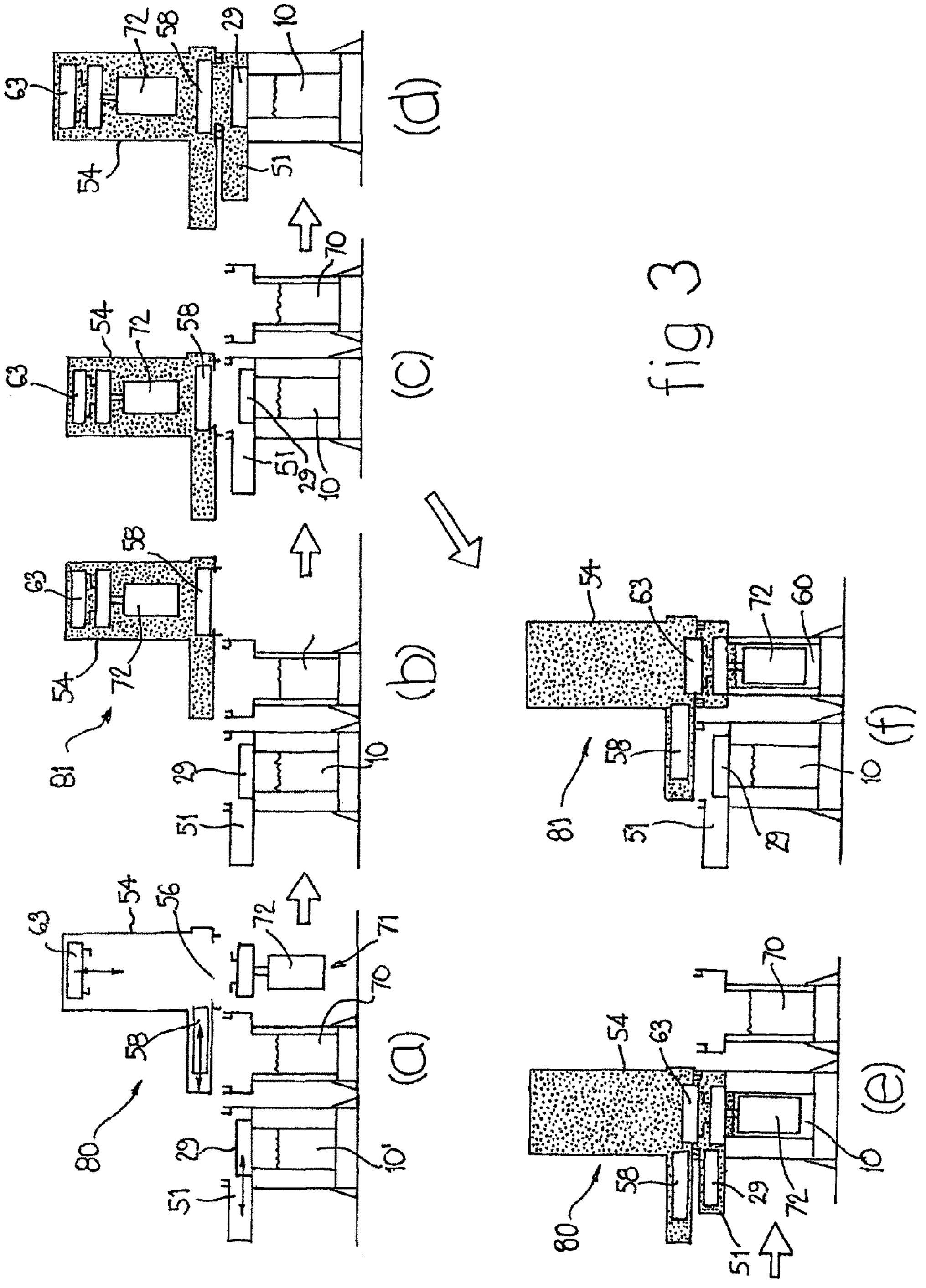
FIG. 3 is schematic views showing a series of steps (a) to (f) in a treatment process according to the present invention.

FIG. 3 illustrates schematically a pair of fluidized bed furnaces 10, 10' (it being understood as discussed above that two such furnaces 10, 10' are preferably provided), a quenching bed 70 (which may be a fluidized bed arrangement), a loading station 71, and a transfer hood 54. It will be understood that suitable means (not illustrated) is provided to move the transfer hood 54 to be positioned operationally over each of the loading station 71 where it can pick up a load 72 (product(s) to be treated) or return same thereto after treatment, the fluidized bed furnaces 10, and the quenching bed 70.

A possible first stage of the process is shown in FIG. 3*a* where the fluidized bed furnace 10 is designed to perform the nitrogen based surface treatment (first stage) of the process and the second of the fluidized bed furnaces 10' (FIG. 3*b*) is designed to carry out stage two 81 of the process. Each will have an intermediate purge chamber 51 (FIG. 4) to allow the product being treated to be transferred by the transfer hood 54 between the two while maintaining the product fully surrounded by an inert atmosphere.

The intermediate purge chambers 51 are designed to:

(i) reduce the oxygen level below 10 ppm before allowing the product being heated to be removed from the fluidized bed undertaking the nitrogen based surface treatment;

(ii) the size of the chamber 51 should be minimized to reduce the amount of gas used to purge the chamber and thereby reduce the overall costs of the process. It is believed that ten gas volume changes of the purge chamber 51 are required to achieve the desired level of less than 10 ppm of oxygen;

(iii) as shown in FIG. 4, the design of the chamber 51 must accommodate the transfer hood to seal the fluidized bed when work is not being processed;

(iv) the construction of the chamber 51 must be such that is has minimal or no oxygen leak rate.

As described previously, the fluidized bed furnaces are designed to allow the introduction of gases including ammonia, nitrogen, carbon dioxide, and HCl gas although the gas supply for the different furnaces 10 may be different. In some cases, a small amount of oxygen might also be supplied to the fluidized bed 10' furnace undertaking the first stage 80, that is the nitriding or nitrocarburising process. The quenching bed 70 may be a standardized fluidized bed except that the top design is such to allow a fast purge between the hood 54 and the quenching bed 70. In consequence the quenching bed 70 may be modified to allow nitrogen not only to be injected through the bed for fluidizing the refractory media (typically aluminium oxide), but also injected over or above the bed to reach the ten volume changes in the space between the top of the refractory media and the underneath of the seal with the transfer hood 54. With the fluidized bed furnace 10 for performing the second stage 81 of the process, the halide gas supply is a separate one and it enters the bed through a separate distributor to the distributor system for the fluidizing gases. To obtain good and relative uniform mixing, the halide gas is pre-mixed with an inert carrier gas before it is introduced through the separate distributor. Moreover, preheating the halide and inert carrier gas flow appears to avoid a problem that can occur in the bottom 25 mm of a bed immediately above the distributor. With cold gas entering at this position, by products may be formed which in a worst case scenario may cause sintering of the metal powder and the refractory media of the bed. In consequence, pre-heating the inert carrier gas containing the active halide gas and the premixing arrangement and delivery systems avoids possible sintering by product effects as aforesaid, reduces the quantity of halide gas required, improves uniformity of processing and eliminates possible by products in the gas mixing panel as well as in the furnace.

FIG. 3(*a*) of the annexed drawings shows the transfer hood 54 at the loading station 71 ready to pick up the load 72 to be treated. A pick up mechanism 63 within the hood 54 enables the load 72 to be picked up and moved into the hood 54. Once this has occurred, the cover member 58 seals the access opening 56 to the hood 54 and the internal volume of the hood 54 is purged with an inert gas such as nitrogen as shown in FIG. 3(*b*). As shown in FIG. 3(*c*), the hood 54 has been moved to be positioned directly over a fluidized bed furnace 10 where it is lowered (FIG. 3(*d*)) to engage the seal means 57. In this position, the intermediate chamber 51 is also purged with an inert gas such as nitrogen. The load to be treated is then lowered into the fluidized bed furnace 10 after opening the cover members 29, 58 as shown in FIG. 3(*e*). In the first stage 80 of treatment, the load undergoes a nitrogen based diffusion process as discussed previously. Once this first stage 80 has been completed the stages shown in FIG. 3 might be retraced to for example FIG. 3(*c*) and from this position, the transfer hood 54 is moved to a second fluidized bed furnace 10, passing through the steps of 3(*d*) and 3(*e*), where the load 72 undergoes the second stage 81 of the process. If quenching is required at any stage, the steps are again retraced to FIG. 3(*c*) and the transfer hood 54 is moved to engage with the quenching bed 70 (FIG. 3(*f*)). Ultimately once the treatment processes are completed the product or load 72 is returned and discharged at the loading bay 71 (FIG. 3(*a*)).

In a potential alternative equipment design, one or two treatment fluidised bed furnaces might be arranged close to one another, possibly with a further fluidized bed capable of acting as a quenching device when required, also located close to the treatment fluidized bed furnace or furnaces. Each such fluidized bed furnace and quenching bed will have a cover structure and seal arrangement as described to enable a desired atmosphere to be maintained in the furnace during a treatment stage. A sealed chamber is configured above the array of fluidized bed furnaces which houses any desired pick up, introduction and transport apparatus to allow a metal part (or parts) to be treated to be introduced into a furnace for a treatment stage, to be removed from the furnace after the treatment stage and to be moved, when desired between furnaces for different treatment stages of the overall treatment process. The sealed chamber provides a volume within which the pick up, introduction and transport apparatus works and the volume includes means to introduce and maintain an inert gas atmosphere therein as previously defined for the intermediate chamber 51 and transport hood 54 of the previously described arrangements. The volume of the sealed chamber should be maintained as low as possible to minimize the utilization of inert gases and thereby minimize costs. The sealed chamber will of course require an access system that is capable of being opened and resealed to introduce metal products to be treated and to remove metal products after treatment. In addition, it is believed desirable to include a viewing panel or panels in the sealed chamber so that an operator can maintain some visual contact with the processes being undertaken.

Figure 7:
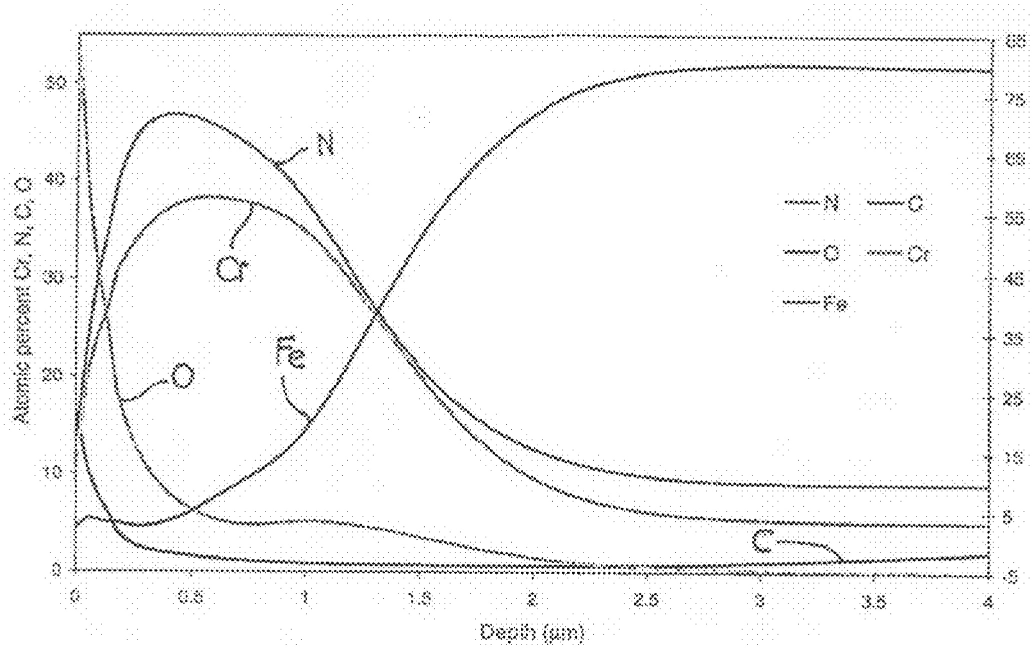
FIG. 7 is a graph showing a composition analysis of a chromium diffused into the surface of an AISI H13 hot-work tool steel in atomic percent made according to the present invention.
Figure 8:
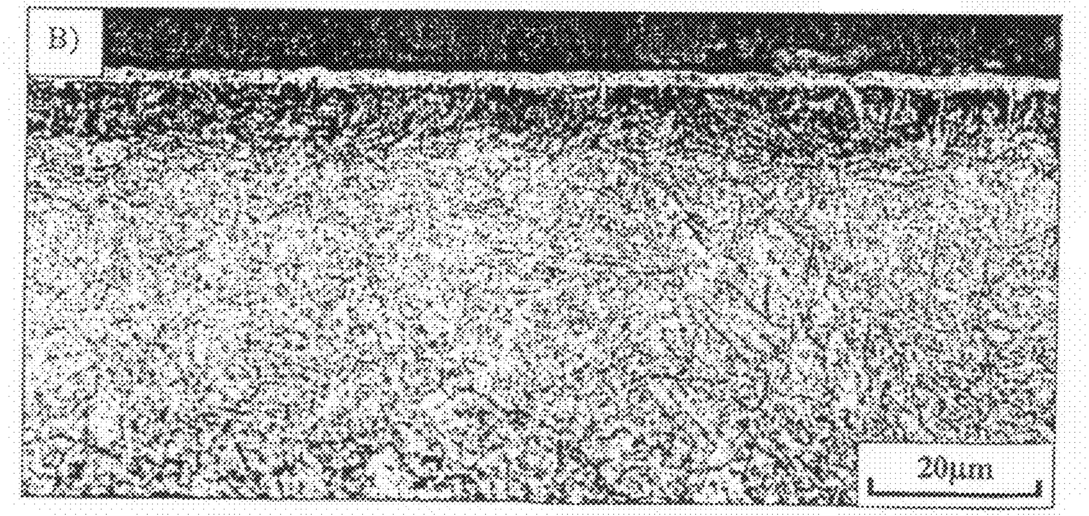
FIG. 8 is a microstructure of the AISI H13 hot-work steel referred to in FIG. 7.

FIGS. 7 and 8 of the annexed drawings provide a representative or illustrative and non-limiting example of a product processed according to the invention. In this case the substrate treated was AISI H13 hot-work steel treated in the second stage in a fluidized bed where the refractory media was aluminium oxide ($Al_2O_3$). The bed also included 10 weight percent of chromium. The gas supplied to the bed comprised 0.5% HCl with the balance being nitrogen ($N_2$). The product was treated in the bed at a temperature of 575° C. for a period of 5 hours.

It is believed the weight percent of metal powder to be diffused into a substrate surface might comprise between 5 and 30 weight percent of the refractory material in the bed. The amount of halide gas might be varied between 0.2 and 3% flow with the balance of the carrier/fluidizing gas being an inert gas such as argon or nitrogen. The processing temperature should be below 750° C. and preferably below 700° C. More preferably, the processing temperature should be in the range of 500 to 700° C. The processing time should be between one and sixteen hours.

The invention claimed is:

1. A fluidized bed furnace for heat treatment of metal substrates, said fluidized bed furnace including:

a retort having an access opening for introduction into and removal of metal substrates from said retort and containing inert particulate refractory material adapted to be fluidized in use;

heat supply means to maintain a predetermined temperature or temperature range within said retort;

a first gas supply means arranged to provide a first inert gas flow entering said retort at a lower region thereof through first distributor means to fluidize the particulate refractory material in said retort;

a second gas supply means arranged to provide a second gas flow entering said retort at or adjacent said lower region thereof separately to said first inert gas flow through second distributor means, said second gas supply means including heating means to heat said second gas flow before said second gas flow enters the retort;

means to combine a halide gas in a predetermined proportion with an inert carrier gas to form said second gas flow externally of the retort;

cover means to open or close said access opening, said cover means closing said access opening during a treatment process; and a first seal means operable between said cover means and said retort when said cover means is positioned to close said access opening;

wherein said first seal means includes a first inner peripheral seal and a second outer peripheral seal each surrounding said retort access opening and defining a first seal zone therebetween, means being provided to introduce an inert gas under pressure into said first seal zone substantially continuously when said cover means is closed during a said treatment process whereby, in use, any inert gas in said first seal zone tends to leak in a direction towards the access opening providing access to said retort;

wherein said first seal means includes a third peripheral seal located inwardly of said first inner peripheral seal, said third peripheral seal including a peripheral flange portion positionable in a third seal region containing inert particulate refractory material when the cover means is positioned to close said access opening, a gas flow supply means being provided to said third seal region to fluidize the inert particulate refractory material therein at least when the cover means is being moved to a position closing said access opening.

2. A fluidized bed furnace according to claim 1 wherein said heating means includes heat exchange means exchanging heat from said fluidized bed with said second gas supply.

3. A fluidized bed furnace according to claim 1 wherein said cover means includes an opening or closing mechanism, said opening or closing mechanism enabling the cover means to be moved in an opening direction away from the access opening in an axial direction and then rotated about a pivot axis parallel to and spaced from a longitudinal axis of the retort with a reverse movement occurring when the cover means is moved to close said access opening.

4. A fluidized bed furnace according to claim 1 wherein said cover means is housed within an intermediate chamber through which access to and from said access opening is achieved, said intermediate changer including an intermediate access opening aligned with the access opening to said retort, said intermediate chamber providing a sealed zone surrounding said cover means except for the intermediate access opening and the access opening to said retort.

5. A fluidized bed furnace according to claim 4 further including a transfer container means defining an internal holding zone accessed through a transfer container access opening, second seal means cooperable between said transfer container means and said intermediate chamber when the transfer container access opening is positioned adjacent the intermediate access opening of the intermediate chamber.

6. A fluidized bed furnace according to claim 5 wherein the second seal means is configured similarly to said first seal means.

7. A fluidized bed furnace according to claim 5 wherein said transfer container means includes a transfer container cover means to selectably open or close said transfer container access opening, third seal means being provided operable between said transfer container cover means and the transfer container access opening when the container cover is moved to a position closing said transfer container access opening.

8. A fluidized bed furnace according to claim 7 wherein the third seal means is configured similarly to said first seal means.

9. A fluidized bed furnace according to claim 7 wherein said transfer container cover means includes an operating mechanism to open or close same, said operating mechanism enabling the transfer container cover means to be moved in an opening direction away from the transfer container access opening in an axial direction and then rotated about a pivot axis parallel to and spaced from a longitudinal axis of the transfer container with a reverse movement occurring when the transfer container cover means is moved to close said transfer container access opening.

10. A fluidized bed furnace according to claim 7 when the second seal means is operationally engaged, the retort access opening, the access opening to the intermediate chamber and the access opening to the transfer container are aligned enabling a substrate to be treated to be transferred to and from said retort to the transfer container.

11. A fluidized bed furnace according to claim 7 wherein inert gas supply means is provided to selectably supply inert gas to said transfer container to enable an inert gas atmosphere to be maintained therein when the transfer container cover means is closed or when it is open but the second seal means are engaged while a substrate to be treated is transferred from said transfer container to said retort.

12. A fluidized bed furnace according to claim 4 wherein inert gas supply means is provided to selectably supply inert gas to said intermediate chamber.

13. A fluidized bed furnace according to claim 1 further including an exhaust gas flow path leading from said retort through a grit collection means to an exhaust gas treatment means, said gas flow path including scraper means to scrape solid deposits from said path and to move same into said collection means.

14. A fluidized bed furnace according to claim 1 further including an exhaust gas flow path leading from said retort, and a metering means to deliver the particulate metal or metal alloy in predetermined quantities into said retort via said exhaust gas flow path, said delivery occurring when minimal or no exhaust gas flow is occurring.

15. A fluidized bed furnace for treatment of metal substrates, said fluidized bed furnace including:

a retort having an access opening for introduction into and removal of metal substrates from said retort and containing inert particulate refractory material adapted to be fluidized in use;

heat supply means to maintain a predetermined temperature or temperature range within said retort;

a first gas supply means arranged to provide a first inert gas flow entering said retort at a lower region thereof through first distributor means to fluidize the particulate refractory material in said retort;

a second gas supply means arranged to provide a second gas flow entering said retort at or adjacent said lower region thereof separately to said first inert gas flow through second distributor means, said second gas supply means including heating means to heat said gas flow before said second gas flow enters the retort;

means to combine a halide gas in a predetermined proportion with an inert carrier gas to form said second gas flow externally of the retort;

cover means to open or close said access opening, said cover means closing said access opening during a treatment process; and a first seal means operable between said cover means and said retort when said cover means is located in a closed position closing said access opening, said first seal means including a first inner peripheral seal and a second outer peripheral seal each comprising a seal flange engaging with a seal material and surrounding said retort access opening to define a first seal zone between said first and said second peripheral seals, a first inert gas supply means provided to introduce an inert gas under pressure into said first seal zone to maintain pressure in said first seal zone greater than atmosphere and greater than gas pressure in said retort when said cover means is closed during a said treatment process, said first seal means further including a third peripheral seal located inwardly of said first inner peripheral seal, said third peripheral seal including a peripheral flange positionable in a third seal region containing inert particulate refractory material when the cover means is in said closed position, a second inert gas supply means being provided to said third seal region to fluidize the inert particulate refractory material in said third seal region at least when the cover means is being moved to said closed position.

16. A fluidized bed furnace according to claim 15 wherein said seal material is VITON seal material or ceramic fiber seal material.

17. A fluidized bed furnace for heat treatment of metal substrates, said fluidized bed furnace including:

a retort having an access opening for introduction into and removal of metal substrates from said retort and containing inert particulate refractory material adapted to be fluidized in use;

heat supply means to maintain a predetermined temperature or temperature range within said retort;

a first gas supply means arranged to provide a first inert gas flow entering said retort at a lower region thereof through distributor means to fluidize the particulate refractory material in said retort;

cover means to open or close said access opening, said cover means closing said access opening during a treatment process of a said metal substrate or metal substrates; and a first seal means is positioned to close said access opening; said first seal means including a first seal chamber positioned outwardly of and peripherally surrounding said access opening, wherein first cooperable seal engaging surfaces of the first seal means separate said first seal chamber from said retort, and second cooperable seal engaging surfaces of the first seal means separate said first seal chamber from atmosphere, said first seal means also having means for supplying and maintaining an inert gas to said first seal chamber whereby the inert gas in said first seal chamber has a pressure higher than atmosphere and higher than gas pressure within said retort at least during a said treatment process.

18. A fluidized bed furnace according to claim 17 wherein inert gas from said first seal chamber is preferentially leaked past said first cooperable seal engaging surfaces towards said retort.

19. A fluidized bed furnace according to claim 17 wherein the first seal means includes a second seal zone surrounding said access opening and located inwardly of said first seal chamber, said second seal zone having a peripheral flange portion positionable in a region containing inert particulate refractory material when the cover means is position to close said access opening, a gas flow supply means being provided to said region to fluidize the inert particulate refractory material therein at least when the cover means is being moved to a position closing said access opening.

20. A fluidized bed furnace for heat treatment of metal substrates, said fluidized bed furnace including:

a retort having an access opening for introduction into and removal of metal substrates from said retort and containing inert particulate refractory material adapted to be fluidized in use;

heat supply means to maintain a predetermined temperature or temperature range within said retort;

a first gas supply means arranged to provide a first inert gas flow entering said retort at a lower region thereof through distributor means to fluidize the particulate refractory material in said retort;

cover means to open or close said access opening, said cover means closing said access opening during a treatment process of a said metal substrate or metal substrates; and a first seal means operable between said cover means and said retort when said cover means is positioned to close said access opening, said first seal means including a first peripheral inner seal and a second outer peripheral seal each comprising a seal flange engageable with a seal material and surrounding said retort access opening to define a first seal zone between said first and second peripheral seals, a first inert gas supply means provided to introduce an inert gas under pressure into said first seal zone to maintain pressure in said first seal zone greater than said atmosphere and greater than gas pressure in said retort when said cover means is closed during a said treatment process, said first seal means further including a third peripheral seal located inwardly of said first inner peripheral seal, said third peripheral seal including a peripheral flange positionable in a third seal region containing inert particulate refractory material when the cover means is in said closed position, a second inert gas supply means being provided to said third seal region to fluidize the inert particulate refractory material in said third seal region at least when the cover means is being moved to said closed position.

* * * * *

UNITED STATES PATENT AND TRADEMARK OFFICE
CERTIFICATE OF CORRECTION

PATENT NO. : 8,317,926 B2
APPLICATION NO. : 11/989092
DATED : November 27, 2012
INVENTOR(S) : Ray William Reynoldson It is certified that error appears in the above-identified patent and that said Letters Patent is hereby corrected as shown below:

Column 13, Line 56: Claim 4, Delete “changer” and insert --chamber--

Signed and Sealed this
Fifth Day of February, 2013

Teresa Stanek Rea
*Acting Director of the United States Patent and Trademark Office*